(12) United States Patent
Li et al.

(10) Patent No.: US 10,191,482 B1
(45) Date of Patent: Jan. 29, 2019

(54) MOTOR CONTROLLER AND METHODS OF MONITORING MOTOR STATUS

(71) Applicant: Regal Beloit America, Inc., Beloit, WI (US)

(72) Inventors: Ming Li, Fort Wayne, IN (US); Roger Carlos Becerra, Fort Wayne, IN (US); Ludovic Andre Chretien, Columbia City, IN (US); Brian Lee Beifus, Fort Wayne, IN (US); Ryan Keith Stephens, Fort Wayne, IN (US); Lester Benjamin Manz, Paulding, OH (US); John Sheldon Wagley, Winona Lake, WI (US)

(73) Assignee: Regal Beloit America, Inc., Beloit, WI (US)

( * ) Notice: Subject to any disclaimer, the term of this patent is extended or adjusted under 35 U.S.C. 154(b) by 0 days.

(21) Appl. No.: 15/654,078

(22) Filed: Jul. 19, 2017

(51) Int. Cl.
| | | |
|---|---|---|
| *G05D 23/00* | (2006.01) | |
| *G05B 23/02* | (2006.01) | |
| *G01R 31/34* | (2006.01) | |
| *H02K 3/26* | (2006.01) | |
| *H02K 11/33* | (2016.01) | |
| *H02K 3/28* | (2006.01) | |

(52) U.S. Cl.
CPC ....... *G05B 23/0264* (2013.01); *G01R 31/343* (2013.01); *H02K 3/26* (2013.01); *G05B 2219/13* (2013.01); *H02K 3/28* (2013.01); *H02K 11/33* (2016.01)

(58) Field of Classification Search
CPC .. G05B 5/00; G05D 23/00; H02P 1/00; H02P 3/00; H02P 6/00; H02P 21/00; H02P 27/04; H02P 27/06; H02P 23/00; H02P 27/00
See application file for complete search history.

(56) References Cited

U.S. PATENT DOCUMENTS

| | | | |
|---|---|---|---|
| 5,917,428 A * | 6/1999 | Discenzo | G01R 31/343 307/116 |
| 6,262,550 B1 | 7/2001 | Kliman et al. | |
| 6,289,735 B1 * | 9/2001 | Dister | G01H 1/003 73/579 |
| 6,434,512 B1 * | 8/2002 | Discenzo | F16C 19/52 702/184 |
| 6,553,816 B1 * | 4/2003 | Palanisamy | F02D 41/22 324/378 |
| 7,750,663 B2 | 7/2010 | Cop | |
| 7,949,483 B2 * | 5/2011 | Discenzo | G05B 19/4062 340/648 |

(Continued)

*Primary Examiner* — Antony M Paul
(74) *Attorney, Agent, or Firm* — Armstrong Teasdale LLP (57) ABSTRACT

A motor controller for controlling an electric motor includes at least one integrated sensor disposed on the electric motor. The least one integrated sensor is configured to collect sensor data associated with a status of the electric motor for a period of time, the period of time beginning at an activation time and extending at least until an installation time. The motor controller may include an energy management system configured to power the at least one integrated sensor for at least a portion of the period of time, and a memory device configured to store the sensor data. The motor controller may include a data management system configured to communicate the sensor data from the at least one integrated sensor to at least one of the memory device and a remote device.

17 Claims, 8 Drawing Sheets

(56) References Cited

U.S. PATENT DOCUMENTS

| | | | |
|---|---|---|---|
| 9,035,675 B2 | 5/2015 | Cop | |
| 9,590,522 B2 | 3/2017 | Suzuki | |
| 2011/0089760 A1* | 4/2011 | Castelaz | H02J 4/00 307/25 |
| 2014/0079564 A1 | 3/2014 | Becerra et al. | |
| 2015/0308347 A1* | 10/2015 | Smith | F02C 7/26 60/778 |
| 2016/0010567 A1* | 1/2016 | Cline | F02C 9/28 60/801 |
| 2016/0123784 A1 | 5/2016 | Brattoli et al. | |
| 2017/0089192 A1* | 3/2017 | Rendusara | E21B 47/0007 |
| 2017/0163200 A1 | 6/2017 | Nardin et al. | |
| 2017/0296173 A1* | 10/2017 | Shelton, IV | A61B 17/068 |

* cited by examiner

MOTOR CONTROLLER AND METHODS OF MONITORING MOTOR STATUS

BACKGROUND

The field of the disclosure relates generally to a controller for an electric motor and, more specifically, a motor controller and methods of using the same to monitor the status of an electric motor before installation and field use of the motor.

It is not uncommon for a motor, such as a motor used in various residential applications, to be produced and to be stored for a period of time before that motor is installed and used "in the field." For instance, the motor may be stored in a production factory, a storage area, various transportation vehicles or location, and/or in OEM warehouses. During this period of time between production and installation, the motor may experience one or more status events that may affect the reliability and/or the lifetime of the motor. The motor may experience a fall event, or may be stored under environmental conditions that can affect electrical or other components of the motor. If any such status events were to negatively affect the performance of the motor, a service technician or other person responsible for repairing the motor would benefit from knowing that such status events occurred. However, there is currently no system designed to track the status of the motor before it is installed.

BRIEF DESCRIPTION

In one aspect, a motor controller for controlling an electric motor is provided. The motor controller includes at least one integrated sensor disposed on the electric motor. The at least one integrated sensor is configured to collect sensor data associated with a status of the electric motor for a period of time. The period of time begins at an activation time and extends at least until an installation time. The motor controller also includes an energy management system configured to power the at least one integrated sensor for at least a portion of the period of time, and a memory device configured to store the sensor data.

In another aspect, a motor controller for controlling an electric motor is provided. The motor controller includes at least one integrated sensor configured to collect sensor data associated with a status of the electric motor for a period of time. The period of time begins at an activation time and extends at least until an installation time. The motor controller also includes a memory device configured to store the sensor data, and a data management system configured to communicate the sensor data from the at least one integrated sensor to at least one of the memory device and a remote component in communication with the data management system.

In yet another aspect, a method of monitoring a status of an electric motor is provided. The method includes installing at least one integrated sensor in a motor controller configured to control the electric motor. The method also includes activating, at an activation time, an energy management system to power the at least one integrated sensor to collect sensor data associated with the status of the electric motor for a period of time. The period of time begins at the activation time and extends at least until an installation time. The method also includes storing the sensor data at a memory device in the motor controller.

DETAILED DESCRIPTION

Embodiments of a motor controller and methods of monitoring a status of an electric motor using a motor controller described herein leverage sensor data collected prior to installation and field use of the motor to facilitate improving insights into motor status and status events. Specifically, the motor controller including an energy management system to power the sensors before the motor is installed, as well as a data management system to enable the motor controller to transmit the collected sensor data to a remote device, such as a service technician's device.

Figure 1:
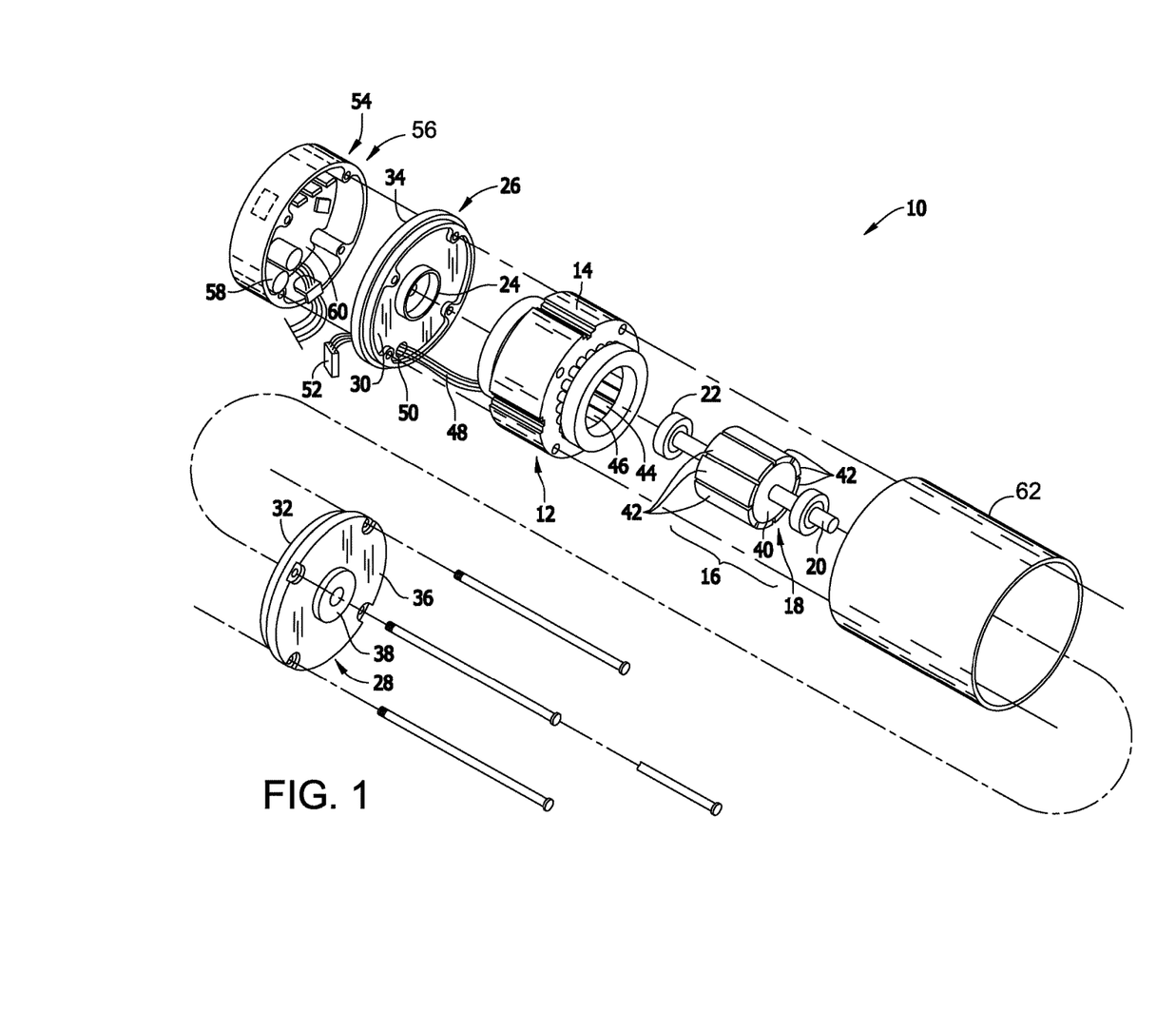
FIG. 1 is an exploded view of an exemplary motor.

FIG. 1 is an exploded view of an exemplary motor 10. Motor 10 includes a stationary assembly 12 including a stator or core 14 and a rotatable assembly 16 including a permanent magnet rotor 18 and a shaft 20. In the exemplary embodiment, motor 10 is utilized as a fan and/or blower motor in a fluid (e.g., water, air, etc.) moving system. For example, motor 10 may be utilized in a clean room filtering system, a fan filter unit, a variable air volume system, a refrigeration system, a furnace system, an air conditioning system, and/or a residential or commercial heating, ventilation, and air conditioning (HVAC) system. Alternatively, motor 10 may be implemented in any application that enables motor 10 to function as described herein. Motor 10 may also be used to drive mechanical components other than a fan and/or blower, including mixers, gears, conveyors, and/or treadmills.

Rotor 18 is mounted on and coupled to shaft 20 for rotation within conventional bearings 22. Bearings 22 are mounted in bearing supports 24 integral with a first end member 26 and a second end member 28. First end member 26 has an inner facing side 30, and second end member 28 has an inner facing side 32. In addition, first end member 26 has an outer side 34, and second end member 28 has an outer side 36. Outer sides 34 and 36 are opposite inner sides 30 and 32 respectively. Stationary assembly 12 and rotatable assembly 16 are located between sides 30 and 32. Additionally, second end member 28 includes an aperture 38 for shaft 20 to extend through outer side 36.

Rotor 18 comprises a ferromagnetic core 40 and is rotatable within stator 14. Rotor core 40 includes a plurality of segments 42 of permanent magnet material, each providing a relatively constant flux field. Segments 42 are secured, for example, by adhesive bonding to rotor core 40. Segments 42 are magnetized to be polarized radially in relation to rotor core 40 with adjacent segments 42 being alternately polarized as indicated. While magnets on rotor 18 are illustrated for purposes of disclosure, it is contemplated that other rotors having different constructions and other magnets different in both number and construction, and flux fields may be utilized with such other rotors within the scope of the invention.

Stationary assembly 12 includes a plurality of windings 44 adapted to be electrically energized by a power source (e.g., utility power) to generate an electromagnetic field, and stator core 14 includes a plurality of teeth 46. Windings 44 are coils of wire wound around teeth 46. Windings 44 terminate in winding terminal leads 48, which are brought out through an aperture 50 in first end member 26 terminating in a connector 52. While stationary assembly 12 is illustrated for purposes of disclosure, it is contemplated that other stationary assemblies of various other constructions having different shapes and with different number of teeth may be utilized within the scope of the invention. Motor 10, in some embodiments, includes any even number of rotor poles and any number of stator poles.

Motor 10 further includes an enclosure 54 which mounts on the rear portion of motor 10. A motor controller 56 includes a plurality of electronic components 58 and a connector (not shown) mounted on a component board 60, such as a printed circuit board. Motor controller 56 is connected to winding stages 44 by interconnecting connector 52. Motor controller 56 applies a current to one or more of winding stages 44 at a time for commutating windings 44 in a preselected sequence to rotate rotatable assembly 16 about an axis of rotation.

A housing 62 is positioned between first end member 26 and second end member 28 to facilitate enclosing and protecting stationary assembly 12 and rotatable assembly 16.

Figure 2:
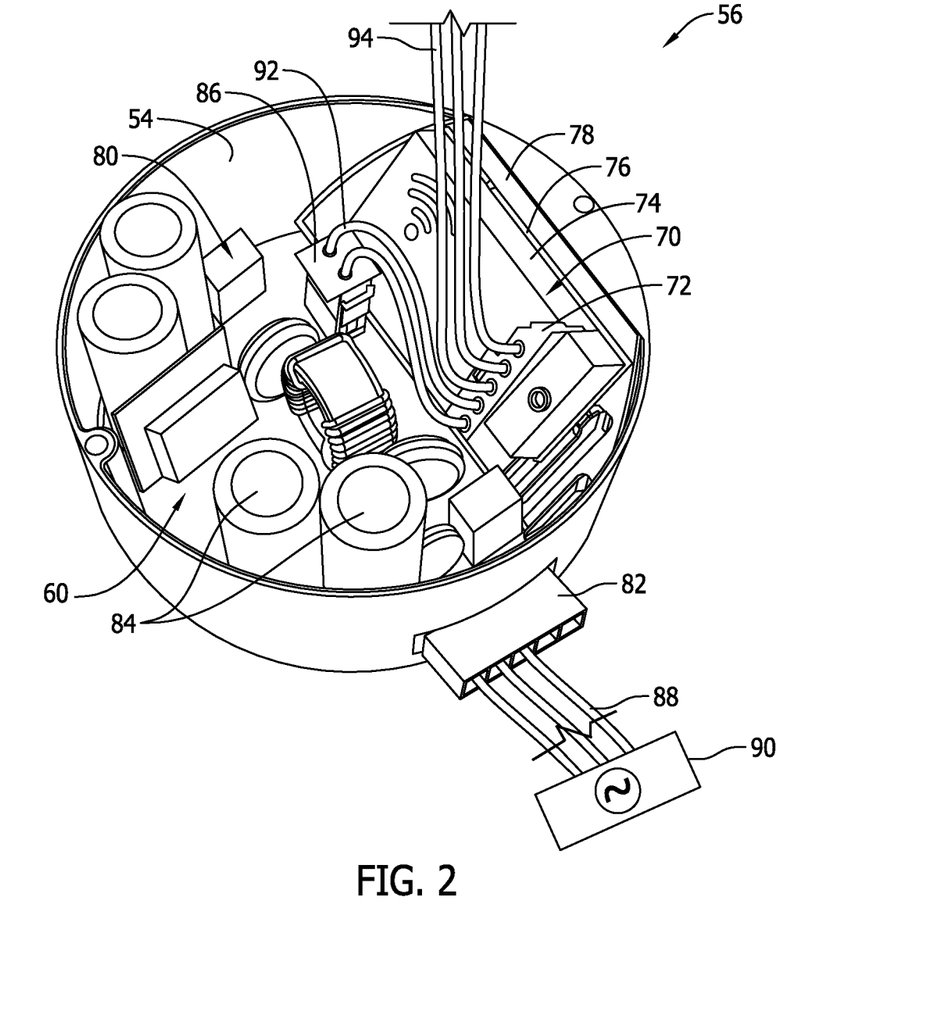
FIG. 2 is a perspective view of an exemplary motor controller for controlling the motor shown in FIG. 1.
Figure 3:
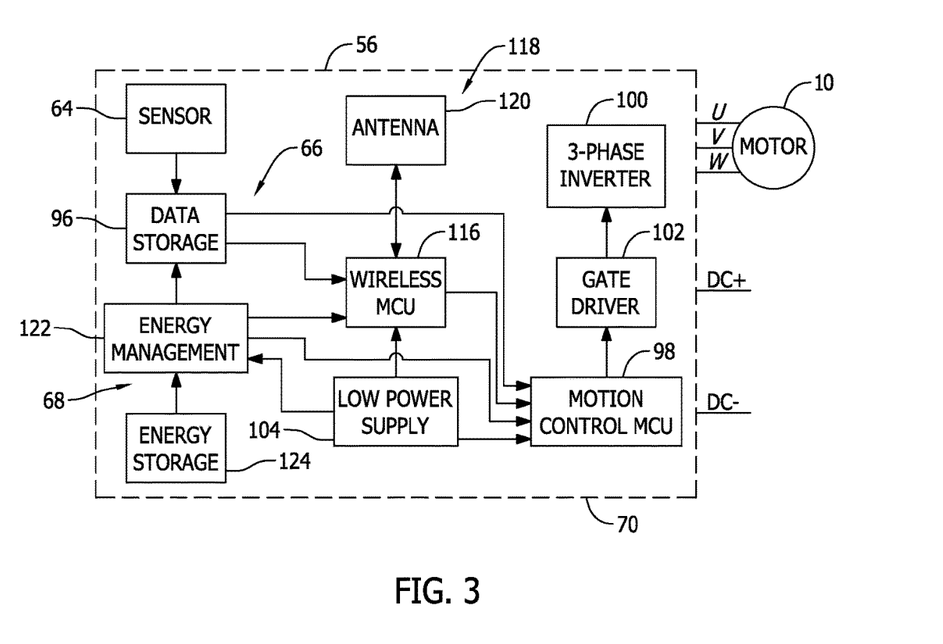
FIG. 3 is a schematic diagram of an exemplary motor controller, such as the motor controller shown in FIG. 2.
Figure 4:
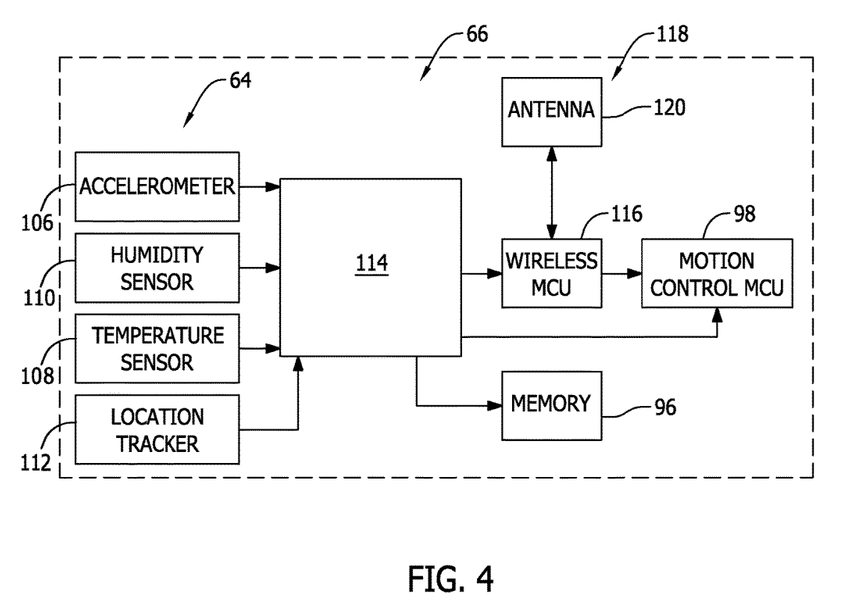
FIG. 4 is a schematic diagram of exemplary sensors and a data management system of the motor controller shown in FIG. 2.
Figure 5:
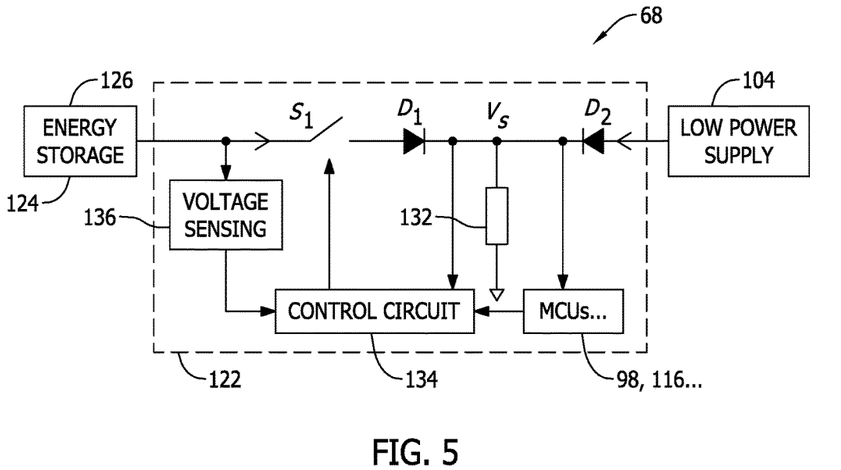
FIG. 5 is a schematic diagram of a first exemplary energy management system of the motor controller shown in FIG. 2.
Figure 6:
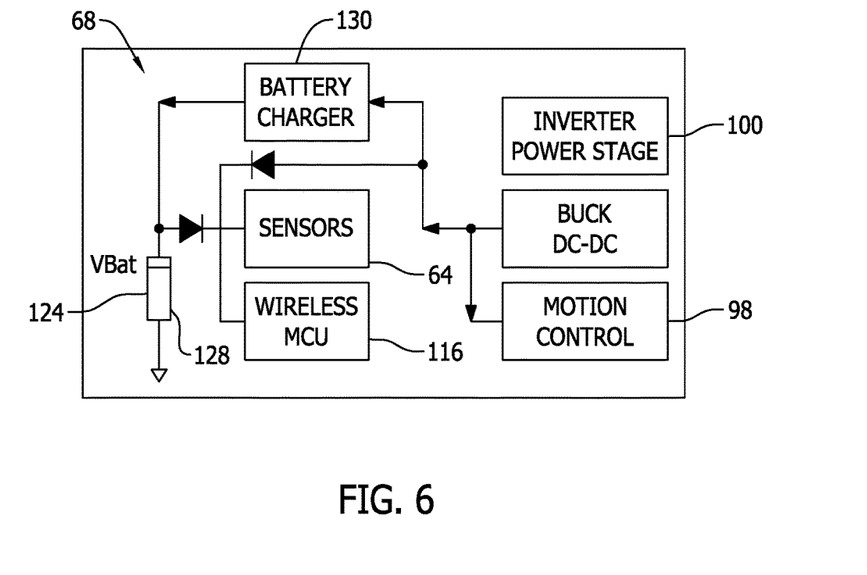
FIG. 6 is a schematic diagram of a second exemplary energy management system of the motor controller shown in FIG. 2.

FIG. 2 is a perspective view of motor controller 56, and FIG. 3 is a block diagram of motor controller 56. As described further herein, motor controller 56 includes a plurality of integrated sensors 64, a data management system 66, and an energy management system 68. FIG. 4 is a block diagram of sensors 64 and data management system 66. FIG. 5 is a block diagram of a first exemplary embodiment of energy management system 68, and FIG. 6 is a block diagram of a second exemplary embodiment of energy management system 68.

With reference to FIG. 2, in the exemplary embodiment, motor controller 56 includes a motor management module 70 disposed within enclosure 54. Motor management module 70 includes an input/output connector 72 and electrical components (shown and described with respect to FIGS. 3-6). Motor management module 70 houses the components within an encapsulated, heat-sharing package 74 that provides protection from damage and/or failure due to moisture entering enclosure 54. In some embodiments, heat-sharing package 74 includes an insulated metal substrate 76 coupled to a metal heatsink 78. For example, heat-sharing package 74 may include an insulated metal substrate (IMS) or a thick printed copper (TPC) based packaging to integrate high power semiconductor devices and all moisture-sensitive components such as integrated circuits and surface mount resistors.

Motor controller 56 further includes a power supply module 80 that, in the illustrated embodiment, is physically separate from, but in electrical connection with, motor management module 70. Power supply module 80 includes an input connector 82, a plurality of electrical components 84, and an output connector 86 mounted on component board 60. In the exemplary embodiment, input connector 82 includes power input line connectors 88 for coupling to a power source 90. Power source 90 (e.g., a utility power source) is configured to transmit AC power such as, but not limited to, high and/or low voltages. Input connector 82 interfaces with and receives AC input power from power source 90. In some embodiments, power is supplied via a system controller (not shown), such as an HVAC system controller. When motor 10 is installed and/or in use, motor 10 is configured to run on AC power supplied from power source 90. More particularly, electrical components 84 of power supply module 80 are configured to convert input AC voltage received from power source 90 to a desired level of direct current (DC) voltage. Using output connector 86, power supply module 80 outputs the converted DC voltage to motor management module 70. Output connector 86 includes two high-voltage wires 92 for providing the converted DC voltage to motor management module 70.

Input/output connector 72 is coupled to high-voltage wires 92 for receiving the converted DC voltage from power supply module 80. Motor management module 70 converts the DC voltage to a three-phase alternating current (AC) voltage for driving electric motor 10 based on instructions received from an external device, for example, an HVAC system controller. Input/output connector 72 outputs the three-phase AC voltage to winding stages 44 (shown in FIG. 1) of motor 10 via output power wires 94.

With reference now to FIG. 3, motor controller 56 includes (and motor management module 70 houses) at least one integrated sensor 64, at least one memory device 96, energy management system 68, and data management system 66. In addition, motor management module 70 may further house additional typical motor control components, such as motion control microcontroller (MCU) 98, an inverter power stage 100, a gate driver 102 that drives inverter power stage 100, and a low power supply 104. Inverter power stage 100 may include an insulated-gate bipolar transistor (IGBT) and/or diode-based three-phase half bridge topology. Low-power supply 104 may provide 15V and 3.3V for low-power circuits. A wireless MCU 116 and antenna 120 (described further herein) are operatively coupled and configured to conduct data processing and communication. Motor controller 56 may include additional typical components, such as a processor, associated with control of motor 10.

With reference to FIG. 4, sensors 64 include one or more of an accelerometer 106, a temperature sensor 108, a humidity sensor 110, and a location tracker 112, generally and collectively referred to as sensors 64. One or more of these sensors 64 may be combined, such as a temperature sensor 108 embedded in an accelerometer 106. In the exemplary embodiment, sensors 64 are disposed on motor 10, and, more particularly, are integrated within motor management module 70. Sensors 64 are configured to monitor a status of motor 10 during a period of time before motor 10 is installed and in use in the field, as described further herein. Sensors 64 are further configured to collect sensor data associated with and descriptive of the status of motor 10 during this period of time. Sensors 64 may be further configured to collect sensor data after motor 10 is installed or commissioned for in-field use.

In one embodiment, accelerometer 106 includes a three-axis digital accelerometer that detects high-g vibration and/or acceleration events, such as a free fall (e.g., from a shelf during storage or transportation) or sharp jostling. For instance, accelerometer 106 may detect an acceleration event, also referred to as an "impact event," having an acceleration above a predefined threshold and generate sensor data associated with that acceleration event. The sensor data may include, for example. but not limited to, the amplitude, magnitude, or value of the acceleration, a direction of the acceleration, and/or a duration of the acceleration. In certain embodiments, accelerometer 106 may further identify a time of the impact event, such that the sensor data includes a timestamp indicating the time of the impact event. Accelerometer 106 may be further configured to detect low-g vibration data, such as vibration associated with motor 10 being powered on and running. In other words, accelerometer 106 may collect sensor data before and during installation and/or in-field operation of motor 10.

Temperature sensor 108 may be embedded in accelerometer 106 and/or may be separate from accelerometer 106, or may be combined with humidity sensor 110. Temperature sensor 108 may be any suitable temperature sensor 108 sized and configured for use within motor management module 70. Temperature sensor 108, in some embodiments, may substantially continuously generate sensor data identifying an ambient temperature of an environment about motor 10 and/or a temperature of enclosure 54 and/or housing 62 (shown in FIG. 1) during the period of time. Additionally or alternatively, temperature sensor 108 may be programmed or configured to only generate sensor data when the ambient temperature exceeds a first predefined threshold, drops below a second predefined threshold, and/or falls outside of a predefined range. In such circumstances, temperature sensor 108 collects a temperature reading and generates sensor data associated with a "temperature event," the sensor data including the temperature reading. In certain embodiments, temperature sensor 108 may further identify a time of the temperature event, such that the sensor data includes a timestamp indicating the time of the temperature event.

Humidity sensor 110 may be any suitable humidity sensor sized and configured for use within motor management module 70. Humidity sensor 110, in some embodiments, may substantially continuously generate sensor data identifying a humidity level of an environment about motor 10 during the period of time. Additionally or alternatively, humidity sensor 110 may be programmed or configured to only generate sensor data when the humidity exceeds a predefined threshold. In such circumstances, humidity sensor 110 collects a humidity reading and generates sensor data associated with a "humidity event," the sensor data including the humidity reading. In certain embodiments, humidity sensor 110 may further identify a time of the humidity event, such that the sensor data includes a timestamp indicating the time of the humidity event.

Location tracker 112 may be any suitable location tracking sensor sized and configured for use within motor management module 70. Location tracker 112, in some embodiments, may substantially continuously generate sensor data identifying a location of motor 10 during the period of time (e.g., as GPS data, latitude-longitude coordinates, location relative to a predefined position, etc.). Additionally or alternatively, location tracker 112 may be programmed or configured to only generate sensor data when another of sensors 64 records a status event, such as an acceleration or impact event, temperature event, and/or humidity event. In such circumstances, location tracker 112 may identify a location of motor 10 at the time the sensor data associated with the status event is generated, and may append the location to the generated sensor data. In certain embodiments, location tracker 112 may further identify a time of the status event and may append a corresponding timestamp to the sensor data associated with the status event.

Although sensors 64 are illustrated and described as being housed within motor management module 70, it should be readily understood that one or more sensors 64 may be disposed on motor 10 in a location other than within motor management module 70, and may be in wired or wireless connection with data management system 66 from that location. Moreover, it should be readily understood that motor controller 56 may include any combination of sensors 64 and/or any number of sensors 64, other than that illustrated in FIG. 4, without departing from the scope of the present disclosure.

Data management system 66 facilitates communicating sensor data collected from sensors 64 to other components. Specifically, data management system 66 facilitates communication of sensor data to memory device 96 and/or to remote devices (not shown), such as a diagnostic device and/or a mobile computing device (e.g., operated by a service technician or user of motor 10).

In the exemplary embodiment, with further reference to FIG. 4, data management system 66 includes a data interface component 114. Data interface component 114 may include a signal bus, such as a direct I$^2$C bus, connecting sensors 64 to memory device 96 and/or to a wireless MCU 116. In some embodiments, upon receipt of the sensor data, memory device 96 and/or wireless MCU 116 appends a date and/or timestamp to the sensor data, identifying the time at which the sensor data was received (which corresponds generally to the time of the associated status event). Memory device 96 and/or wireless MCU 116 may subsequently pass the sensor data to a wireless communication component 118 (i.e., for transmittal to a remote device). In other embodiments, additional storage and/or processing capability may be needed for the amount and/or type of sensor data generated by sensors 64. In such embodiments, data interface component 114 may include an EEPROM (or other intermediate storage component) and additional MCU, for intermediate storage of the sensor data. In some embodiments, data interface component 114 appends a date and/or timestamp to the sensor data, identifying the time at which the sensor data was received and transmitted to another component (which corresponds generally to the time of the associated status event).

In addition, data management system 66 includes at least one transmitting and/or receiving component. More particularly, data management system 66 includes wireless communication component 118 that facilitates receiving wireless signals and/or transmitting wireless signals. Wireless communication component 118 enables wireless communication between a remote device (e.g., a remote device of a manufacturer of motor 10, an HVAC system manufacturer using motor 10, a technician of motor 10, and/or a customer owning motor 10) and motor controller 56. Wireless signals may include, but are not limited to, Bluetooth®, Bluetooth® low energy, near field communications (NFC), ZigBee®, Wi-Fi, Z-Wave, RFID, infrared, and/or any other known types of wireless signals. Transmitted wireless signals may include, as described herein, sensor data transmitted from motor controller 56 to the remote device. Received wireless signals may include interrogation signals transmitted from the remote device to motor controller 56, activating motor controller 56 to transmit stored sensor data. In some embodiments, wireless communication component 118 includes an antenna 120, such as a three-dimensional (3D) antenna or a ceramic antenna. In other embodiments, other suitable types of antennas 120 may be used. Alternatively, wireless communication component 118 may include other transmitter, receiver, and/or transceiver element(s).

Turning now to FIGS. 5 and 6, motor controller 56 includes energy management system 68. Energy management system 68 includes an energy management circuit 122 and an energy storage component 124 to power sensors 64 and data management system 66 during a period of time before motor 10 is installed and connected to power source 90 (e.g., utility power).

Figure 7:
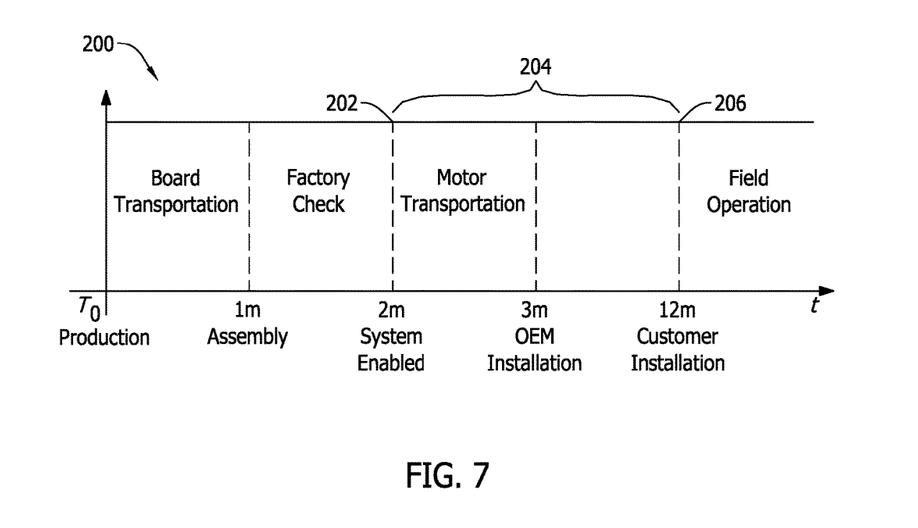
FIG. 7 depicts an exemplary timeline associated with operation of the motor controller illustrated in FIG. 2.

FIG. 7 illustrates an exemplary timeline 200 of a lifetime of motor 10, including motor controller 56, between production and field operation. At an activation time 202, energy management system 68 is enabled or activated and begins providing power to sensors 64 and data management system 66. In other words, activation time 202 refers to the activation of energy management system 68 and a beginning of a period of time 204 over which sensors 64 are monitoring the status of motor 10 and collecting sensor data. Activation may occur at a production facility (e.g., factory) of motor 10. Activation time 202 is illustrated as two months after production of motor 10 but is not limited thereto. At activation time 202, any timing circuitry (not specifically shown) of motor controller 56 and/or specific components thereof (e.g., of one or more sensors 64 or energy management system 68) is activated. Accordingly, in at least some embodiments, any timestamps recorded and appended to collected sensor data may be relative to activation time 202. Alternatively, the timing circuitry may monitor "absolute" time, and the timestamps may be absolute (i.e., record an absolute time, rather than a relative time).

Energy management system 68 provides such power until an installation time 206, illustrated as twelve months after production of motor 10 but not limited thereto, at which motor 10 is installed and ready for use. More particularly, installation time 206 represents the time at which motor 10 is coupled to power source 90, which is then configured to power motor 10 for field use. In other words, installation time 206 refers to the time at which motor 10 is commissioned in the field for its ultimate use (e.g., within an HVAC system). In some cases, energy storage component 124 may deplete or run out of stored energy before installation time 206. In such cases, energy management system 68 may only function to provide power to sensors 64 and data management system 66 until energy storage component 124 is depleted. In other cases, energy storage component 124 may have additional energy remaining at installation time 206. In such cases, energy management system 124 may be configured to provide power to one or more components of motor controller 56 and/or motor 10 in the event that motor 10 is disconnected from power source 90. Moreover, in such cases, sensors 64 may be further configured to collect sensor data including failure data associated with one or more failure events of motor 10 after installation time 206.

Returning to FIGS. 5 and 6, energy storage component 124 may include any suitable energy storage element, such as a battery or a super capacitor. Energy storage component 124 is enabled at activation time 202 (shown in FIG. 7). Energy storage component 124 may be manually enabled by a technician or may be automatically enabled using an automated process. In FIG. 5, energy storage component 124 is embodied as a non-rechargeable battery 126 housed within motor management module 70 (e.g., soldered onto surface-mount pins on a board, such as an IMS board). Battery 126 may include, for example, a coin cell-type 3V battery. Battery 126 has a predefined lifetime, such as one year, two years, etc. In FIG. 6, energy storage component 124 is embodied as a rechargeable battery 128, and energy management system 68 further includes a battery charger 130 suitable for charging battery 128. In such cases, motor management module 70 and/or enclosure 54 may include a charging port (not shown) accessible to a user on the exterior of motor 10.

Energy management circuit 122, as illustrated in FIG. 5, includes a switch $S_1$ between battery 126 and a load 132 (e.g., sensors 64 and/or data management system 66), switch $S_1$ having reverse blocking capability. Switch $S_1$ may include a PNP BJT or P-channel MOSFET. Switch $S_1$ is in series with a blocking diode $D_1$ to prevent a charging current from low power supply 104. The effective voltage $V_S$ powers a control circuit 134, sensors 64, data management system 66, and/or additional loads. In addition, a voltage sensing circuit 136 monitors the terminal voltage of battery 126 and transmits this information to control circuit 134. Control circuit 134 monitors the lifetime of battery 126 according to the voltage. Another diode $D_2$ is used to reduce the load for battery 126 so that energy of battery 126 can be regulated efficiently.

Figure 8:
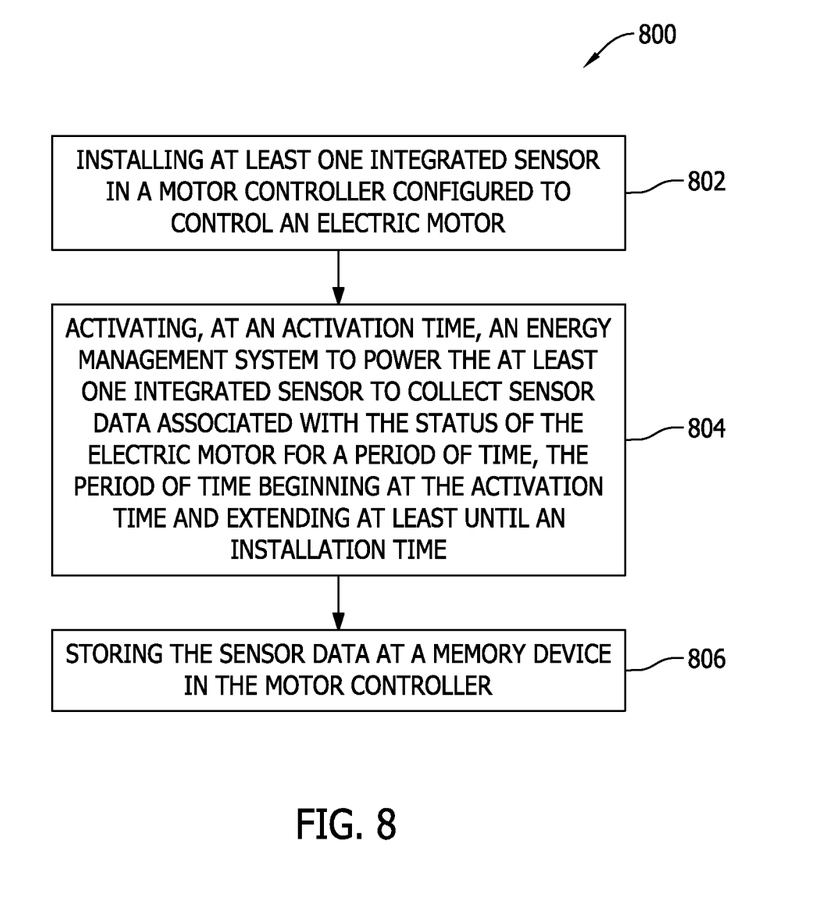
FIG. 8 is a flow diagram of an exemplary method of monitoring a status of an electric motor, such as the motor shown in FIG. 1.

FIG. 8 is a flow diagram of an exemplary method 800 of monitoring a status of an electric motor (e.g., motor 10 shown in FIG. 1). Method 800 is at least partially performed by a controller (e.g., motor controller 56 shown in FIG. 1). In other embodiments, method 800 may include additional, fewer, or alternative steps, including those described elsewhere herein.

In the illustrated embodiment, method 800 includes installing 802 at least one integrated sensor (e.g., sensors 64, shown in FIG. 3) in a motor controller configured to control the electric motor. Method 800 also include activating 804, at an activation time (e.g., activation time 202, shown in FIG. 7), an energy management system (e.g., energy management system 68, shown in FIG. 3) to power the at least one integrated sensor to collect sensor data associated with the status of the electric motor for a period of time (e.g., period of time 204, shown in FIG. 7). The period of time begins at the activation time and extends at least until an installation time (e.g., installation time 206 also shown in FIG. 7). Method 800 further includes storing 806 the sensor data at a memory device (e.g., memory device 96, shown in FIG. 3) in the motor controller.

In some embodiments, method 800 further includes operating the motor using an external power source (e.g., power source 90, shown in FIG. 2) at the installation time. Operating the motor using the external power source includes deactivating the energy management system.

The methods and systems described herein may be implemented using computer programming or engineering techniques including computer software, firmware, hardware or any combination or subset thereof, wherein the technical effect may include at least one of: (a) improving knowledge of and insight into storage and transport conditions of a motor that may affect reliability, performance, and/or lifetime of the motor; (b) providing an energy management system that enables monitoring status of the motor using sensors disposed on the motor, collecting sensor data, and storing sensor data, when the motor is not connected to utility power; and/or (c) providing a data management system that enables transmission of collected and/or stored sensor data to a remote system for diagnostics.

In the foregoing specification and the claims that follow, a number of terms are referenced that have the following meanings.

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here, and throughout the specification and claims, range limitations may be combined or interchanged. Such ranges are identified and include all the sub-ranges contained therein unless context or language indicates otherwise.

Some embodiments involve the use of one or more electronic processing or computing devices. As used herein, the terms "processor" and "computer" and related terms, e.g., "processing device", "computing device", and "controller" are not limited to just those integrated circuits referred to in the art as a computer, but broadly refers to a processor, a processing device, a controller, a general purpose central processing unit (CPU), a graphics processing unit (GPU), a microcontroller, a microcomputer, a programmable logic controller (PLC), a reduced instruction set computer (RISC) processor, a field programmable gate array (FPGA), a digital signal processing (DSP) device, an application specific integrated circuit (ASIC), and other programmable circuits or processing devices capable of executing the functions described herein, and these terms are used interchangeably herein. The above examples are exemplary only, and thus are not intended to limit in any way the definition or meaning of the terms processor, processing device, and related terms.

In the embodiments described herein, memory may include, but is not limited to, a non-transitory computer-readable medium, such as flash memory, a random access memory (RAM), read-only memory (ROM), erasable programmable read-only memory (EPROM), electrically erasable programmable read-only memory (EEPROM), and non-volatile RAM (NVRAM). As used herein, the term "non-transitory computer-readable media" is intended to be representative of any tangible, computer-readable media, including, without limitation, non-transitory computer storage devices, including, without limitation, volatile and non-volatile media, and removable and non-removable media such as a firmware, physical and virtual storage, CD-ROMs, DVDs, and any other digital source such as a network or the Internet, as well as yet to be developed digital means, with the sole exception being a transitory, propagating signal. Alternatively, a floppy disk, a compact disc-read only memory (CD-ROM), a magneto-optical disk (MOD), a digital versatile disc (DVD), or any other computer-based device implemented in any method or technology for short-term and long-term storage of information, such as, computer-readable instructions, data structures, program modules and sub-modules, or other data may also be used. Therefore, the methods described herein may be encoded as executable instructions, e.g., "software" and "firmware," embodied in a non-transitory computer-readable medium. Further, as used herein, the terms "software" and "firmware" are interchangeable, and include any computer program stored in memory for execution by personal computers, workstations, clients and servers. Such instructions, when executed by a processor, cause the processor to perform at least a portion of the methods described herein.

Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to provide details on the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A motor controller for controlling an electric motor, said motor controller comprising:
   at least one integrated sensor disposed on the electric motor, said at least one integrated sensor configured to collect sensor data associated with a status of the electric motor for a period of time, the period of time beginning at an activation time and extending at least until an installation time, wherein the activation time is a time at which the energy management system is activated to power said at least one integrated sensor;
   an energy management system configured to power said at least one integrated sensor for at least a portion of the period of time; and
   a memory device configured to store the sensor data.

2. The motor controller of claim 1 further comprising a data management system configured to communicate the sensor data from said at least one integrated sensor to at least one of said memory device and a remote component in communication with said data management system.

3. A motor controller for controlling an electric motor, said motor controller comprising:
   at least one integrated sensor configured to collect sensor data associated with a status of the electric motor for a period of time, the period of time beginning at an activation time and extending at least until an installation time, wherein the activation time is a time at which an energy management system is activated to power said at least one integrated sensor;
   a memory device configured to store the sensor data; and a data management system configured to communicate the sensor data from said at least one integrated sensor to at least one of said memory device and a remote component in communication with said data management system.

4. The motor controller of claim 3, wherein said data management system is activated in response to an interrogation signal from the remote component.

5. The motor controller of claim 3 further comprising an energy management system configured to power said at least one integrated sensor for at least a portion of the period of time.

6. The motor controller of claim 5, wherein said energy management system is further configured to power said data management system for at least a portion of the period of time.

7. The motor controller of claim 3, wherein said data management system comprises an antenna.

8. A method of monitoring a status of an electric motor, said method comprising:
  installing at least one integrated sensor in a motor controller configured to control the electric motor;
  activating, at an activation time, an energy management system to power the at least one integrated sensor to collect sensor data associated with the status of the electric motor for a period of time, the period of time beginning at the activation time and extending at least until an installation time;
  operating the electric motor using an external power source at the installation time, said operating deactivating the energy management system; and
  storing the sensor data at a memory device in the motor controller.

9. A motor controller for controlling an electric motor, said motor controller comprising:
  at least one integrated sensor disposed on the electric motor, said at least one integrated sensor configured to collect sensor data associated with a status of the electric motor for a period of time, the period of time beginning at an activation time and extending at least until an installation time, wherein the sensor data includes at least one status event and a timestamp respectively associated with each at least one status event;
  an energy management system configured to power said at least one integrated sensor for at least a portion of the period of time; and
  a memory device configured to store the sensor data.

10. The motor controller of claim 9, wherein the timestamp is relative to the activation time.

11. A motor controller for controlling an electric motor, said motor controller comprising:
  at least one integrated sensor disposed on the electric motor, said at least one integrated sensor configured to collect sensor data associated with a status of the electric motor for a period of time, the period of time beginning at an activation time and extending at least until an installation time, wherein said at least one integrated sensor comprises at least one of an accelerometer, a temperature sensor, a humidity sensor, and a location sensor, wherein the sensor data includes at least one status event and a timestamp respectively associated with each at least one status event;
  an energy management system configured to power said at least one integrated sensor for at least a portion of the period of time; and
  a memory device configured to store the sensor data.

12. The motor controller of claim 11, wherein said at least one integrated sensor comprises said accelerometer, wherein one status event includes an impact event, and wherein the timestamp includes a time at which impact event occurred relative to the activation time.

13. The motor controller of claim 12, wherein the impact event includes an amplitude of an acceleration sensed by said accelerometer when the amplitude is above a threshold.

14. The motor controller of claim 11, wherein said at least one integrated sensor comprises said temperature sensor configured to collect at least one temperature reading when a temperature sensed by said temperature sensor is above a threshold, and wherein the sensor data includes the at least one temperature reading.

15. A motor controller for controlling an electric motor, said motor controller comprising:
  at least one integrated sensor disposed on the electric motor, said at least one integrated sensor configured to collect sensor data associated with a status of the electric motor for a period of time, the period of time beginning at an activation time and extending at least until an installation time, wherein said at least one integrated sensor comprises said humidity sensor configured to collect at least one humidity reading when a humidity sensed by said humidity sensor is above a threshold, and wherein the sensor data includes the at least one humidity reading;
  an energy management system configured to power said at least one integrated sensor for at least a portion of the period of time; and
  a memory device configured to store the sensor data.

16. A motor controller for controlling an electric motor, said motor controller comprising:
  at least one integrated sensor disposed on the electric motor, said at least one integrated sensor configured to collect sensor data associated with a status of the electric motor for a period of time, the period of time beginning at an activation time and extending at least until an installation time;
  an energy management system configured to power said at least one integrated sensor for at least a portion of the period of time, wherein said energy management system comprises an energy storage component and a control circuit configured to manage energy output from said energy storage component and monitor a lifetime of said energy storage component; and
  a memory device configured to store the sensor data.

17. The motor controller of claim 16, wherein said energy management system is configured to power said at least one integrated sensor until the installation time.

* * * * *